US009990897B2

(12) United States Patent
Pang (10) Patent No.: US 9,990,897 B2
(45) Date of Patent: Jun. 5, 2018

(54) SHIFT REGISTER UNIT, GATE DRIVING CIRCUIT AND DRIVING METHOD THEREOF, AND ARRAY SUBSTRATE (71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Fengchun Pang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 177 days.

(21) Appl. No.: 15/133,398

(22) Filed: Apr. 20, 2016

(65) Prior Publication Data
US 2016/0358666 A1 Dec. 8, 2016

(30) Foreign Application Priority Data

Jun. 8, 2015 (CN) .......................... 2015 1 0312064

(51) Int. Cl.
*G11C 19/00* (2006.01)
*G09G 3/36* (2006.01)
*G11C 19/28* (2006.01)

(52) U.S. Cl.
CPC ......... *G09G 3/3688* (2013.01); *G09G 3/3677* (2013.01); *G11C 19/287* (2013.01);
(Continued)

(58) Field of Classification Search
None
See application file for complete search history.

(56) References Cited

U.S. PATENT DOCUMENTS

2012/0008731 A1* 1/2012 Hsu .................. G11C 19/28
377/79
2012/0044133 A1 2/2012 Nakamizo et al.
(Continued)

FOREIGN PATENT DOCUMENTS

| CN | 103280200 A | 9/2013 |
| CN | 103345941 A | 10/2013 |
| CN | 103500551 A | 1/2014 |
| CN | 103714792 A | 4/2014 |

(Continued)

OTHER PUBLICATIONS

China Office Action for Application No. 201510312064.X; dated Dec. 9, 2016, 23 pps.

*Primary Examiner* — Tuan T Lam
(74) *Attorney, Agent, or Firm* — Armstrong Teasdale LLP (57) ABSTRACT

A shift register unit is provided. The shift register unit includes a first input module configured to output a first voltage signal as a pull-up control signal under the control of a first signal, a first reset module configured to reset the pull-up control signal under the control of a first reset signal, a pull-up module configured to output a first clock signal under the control of the pull-up control signal, a pull-down control module configured to output a second clock signal as a pull-down control signal under the control of a second clock signal, a pull-down module configured to pull down a voltage of the pull-up control signal, a first output module, and a second output module.

16 Claims, 5 Drawing Sheets

(52) U.S. Cl.
CPC ........... *G09G 2300/0408* (2013.01); *G09G 2300/0426* (2013.01); *G09G 2310/0286* (2013.01); *G09G 2310/0289* (2013.01); *G09G 2310/08* (2013.01); *G11C 19/28* (2013.01)

(56) References Cited

U.S. PATENT DOCUMENTS

| | | | |
|---|---|---|---|
| 2012/0194489 A1* | 8/2012 | Iwamoto | G09G 3/3685 |
| | | | 345/204 |
| 2013/0088265 A1* | 4/2013 | Chen | H03K 5/153 |
| | | | 327/108 |
| 2015/0159997 A1* | 6/2015 | Kim | G01B 17/025 |
| | | | 356/503 |
| 2015/0325181 A1* | 11/2015 | Wang | G09G 3/3677 |
| | | | 377/64 |
| 2016/0012764 A1* | 1/2016 | Xu | G11C 19/28 |
| | | | 345/204 |
| 2016/0027526 A1* | 1/2016 | Xu | G11C 19/28 |
| | | | 345/215 |
| 2016/0268004 A1* | 9/2016 | Li | G11C 19/28 |
| 2017/0039968 A1* | 2/2017 | Chen | G09G 3/3648 |
| 2017/0153742 A1* | 6/2017 | Pang | G06F 3/0416 |
| 2017/0178558 A1* | 6/2017 | Zhou | G09G 3/2092 |
| 2017/0178584 A1* | 6/2017 | Ma | G09G 3/3677 |
| 2017/0186393 A1* | 6/2017 | Wang | G09G 3/3677 |

FOREIGN PATENT DOCUMENTS

| | | |
|---|---|---|
| CN | 103761937 A | 4/2014 |
| CN | 104157248 A | 11/2014 |
| CN | 104658506 A | 5/2015 |

* cited by examiner

SHIFT REGISTER UNIT, GATE DRIVING CIRCUIT AND DRIVING METHOD THEREOF, AND ARRAY SUBSTRATE

CROSS REFERENCE TO RELATED APPLICATIONS

This application claims the benefit and priority of Chinese Patent Application No. 201510312064.X filed on Jun. 8, 2015, the entire content of which is incorporated herein by reference.

BACKGROUND

The present invention generally relates to display technologies, and more particularly, to a shift register unit, a gate driving circuit and driving method thereof, and an array substrate.

Liquid crystal display (LCD) has advantages of low radiation, small volume, low power consumption etc., and is widely used in electronic products such as laptop, flat-screen TVs, or mobile phones, etc. The LCD is composed of pixel units arranged in a matrix. When LCD is displaying, a data driving circuit latches inputted display data and clock signals in a timing manner, and converts them into analog signals which are subsequently inputted to data lines of the LCD panel. The gate driving circuit may convert the inputted clock signals into voltages for controlling on/off of the pixel units via a shift register, and applies the voltages to gate lines of the LCD panel line-by-line.

In order to reduce the manufacture cost of the LCD products, the gate driving circuit usually integrates gate switch circuits of thin film transistors (TFTs) onto an array substrate of a display panel by means of gate driver on array (GOA) technology, to achieve scan driving for the display panel. Such the gate driving circuit integrated onto the array substrate by means of the GOA technology is also referred to as GOA circuit or shift register circuit. Because of omitting a part for binding the driving circuit, the display device with such GOA circuit thus reduces the material cost and the cost of manufacture process. Furthermore, the GOA circuit may be arrange at both sides of an active area of the display panel, i.e. in border area of the display panel, and scan the gate lines in turn by bilateral cross driving, so as to achieve image displaying. Since the GOA circuit may be arranged at both sides of the display panel, it is possible to provide the display panel with a symmetrical structure.

Currently, there is a demand for a display panel with a narrow frame, or even without the frame. However, the occupation space of the GOA circuit is reduced as the increasing of resolution of the display panel and the increasing of the amount of pixel units. To ensure the sufficient wiring space for the GOA circuit, it is required to increase the frame area of the display panel, which may not result in the display panel with the ultra-narrow frame or without the frame.

BRIEF DESCRIPTION

Embodiments described herein provide a shift register unit, a gate driving circuit and driving method thereof, and an array substrate, which can be applied to the high-resolution display panel, without increasing the frame size of the display panel, so as to implement the display panel with the ultra-narrow frame or without the frame.

In one aspect, a shift register unit is provided. The shift register unit includes a first input module, a first reset module, a pull-up module, a pull-down control module, a pull-down module, a first output module, and a second output module. The first input module is connected to a first voltage terminal to be inputted with a first voltage signal, is connected to a first signal input terminal to be inputted with a first signal, and is configured to output a first voltage signal as the pull-up control signal under the control of the first signal. The first reset module is connected to the first input module, is connected to a second voltage terminal to be inputted with a second voltage signal, and is connected to a first reset signal terminal to be inputted with a first reset signal, and is configured to reset the pull-up control signal under the control of the first reset signal. The pull-up module is connected to the first input module, and is connected to a first clock signal terminal to be inputted with a first clock signal, and is configured to output the first clock signal, under the control of the pull-up control signal, as a third output signal which is outputted via the third signal output terminal. The pull-down control module is connected to the first input module, is connected to a second clock signal terminal to be inputted with a second clock signal, and is connected to a third voltage terminal to be inputted with a third voltage signal, and is configured to output the second clock signal as a pull-down control signal under the control of the second clock signal, and to pull down a voltage of the pull-down control signal to be identical with that of the third voltage signal under the control of the pull-up control signal. The pull-down module is connected to the first input module, the pull-down control module and the pull-up module, and is connected to the third voltage terminal to be inputted with the third voltage signal, and is configured to pull down a voltage of the pull-up control signal and a voltage of the third output signal to be identical with that of the third voltage signal under the control of the pull-down control signal. The first output module is connected to a third clock signal terminal to be inputted with a third clock signal, and is connected to the pull-up module, and is configured to output the third clock signal, under the control of the third output signal, as a first output signal which is outputted via the first signal output terminal. The second output module is connected to a fourth clock signal terminal to be inputted with a fourth clock signal, and is connected to the pull-up module, and is configured to output the fourth clock signal, under the control of the third output signal, as a second output signal which is outputted via a second signal output terminal.

In one embodiment, the shift register unit may further include a second input module, which is connected to the first voltage terminal to be inputted with the first voltage signal, and connected to a second signal input terminal to be inputted with the second signal, and configured to output the first voltage signal as the pull-up control signal under the control of the second signal.

In one embodiment, the shift register unit may further include a second reset module, which is connected to the second voltage terminal to be inputted with the second voltage signal, and connected to a second reset signal terminal to be inputted with a second reset signal, and configured to reset the pull-up control signal under the control of the second reset signal.

In one embodiment, the first output module may include a twelfth transistor. A gate of the twelfth transistor is connected to the pull-up module, a first electrode is connected to the first signal output terminal, and a second electrode is connected to the third clock signal terminal.

In one embodiment, the second output module may include a thirteenth transistor. A gate of the thirteenth transistor is connected to the pull-up module, a first electrode is connected to the fourth clock signal terminal, and a second electrode is connected to the second signal output terminal.

In one embodiment, the second input module may include a fourteenth transistor. A gate of the fourteenth transistor is connected to the second signal input terminal, a first electrode is connected to the pull-up module, and a second electrode is connected to the first voltage terminal.

In one embodiment, the second reset module may include a fifteenth transistor. A gate of the fifteenth transistor is connected to the second reset signal terminal, a first electrode is connected to the second voltage terminal, and a second electrode is connected to the second input module.

In one embodiment, the first input module may include a first transistor. A gate of the first transistor is connected to the first signal input terminal, a first electrode is connected to the pull-up module, and a second electrode is connected to the first voltage terminal.

In one embodiment, the first reset module may include a second transistor. A gate of the second transistor is connected to the first reset signal terminal, a first electrode is connected to the second voltage terminal, and a second electrode is connected to the first input module.

In one embodiment, the pull-up module may include a third transistor and a storage capacitor. A gate of the third transistor is connected to the first input module, a first electrode is connected to the third signal output terminal, and a second electrode is connected to the first clock signal terminal. The storage capacitor is connected between the gate of the third transistor and the first electrode of the third transistor.

In one embodiment, the pull-up module may include a third transistor and a storage capacitor. A gate of the third transistor is connected to the first input module and the second input module, a first electrode is connected to the third signal output terminal, and a second electrode is connected to the first clock signal terminal. The storage capacitor is connected between the gate of the third transistor and the first electrode of the third transistor.

In one embodiment, the pull-down control module may include a fifth transistor, a sixth transistor, an eighth transistor, and a ninth transistor. A gate of the fifth transistor is connected to a second electrode of the eighth transistor, a first electrode is connected to the pull-down module, and a second electrode is connected to the second clock signal terminal. A gate of the sixth transistor is connected to the first input module, a first electrode is connected to the third voltage terminal, and a second electrode is connected to the first electrode of the fifth transistor. A gate of the eighth transistor is connected to the pull-up module, and a first electrode is connected to the third voltage terminal. A gate and a second electrode of the ninth transistor are each connected to the second clock signal terminal, and a first electrode is connected to the second electrode of the eighth transistor.

In one embodiment, the pull-down module may include a tenth transistor and an eleventh transistor. A gate of the tenth transistor is connected to the pull-down control module, a first electrode is connected to the third voltage terminal, and a second electrode is connected to the first input module. A gate of the eleventh transistor is connected to the gate of the tenth transistor, a first electrode is connected to the third voltage terminal, and a second electrode is connected to the pull-up module.

In one embodiment, the pull-down module may further include a fourth transistor. A gate of the fourth transistor is connected to the second clock signal terminal, a first electrode is connected to the third voltage terminal, and a second electrode is connected to the pull-up module.

In another aspect, a gate driving circuit that includes at least two cascaded shift register units described above is provided. The first stage of shift register unit of the at least two shift register units further comprises a second input module and a second reset module. The third output signal of the shift register unit other than the last stage of shift register unit of the at least two shift register units is used as the first signal for the next stage of shift register unit. The third output signal of the last stage of shift register unit is used as the second signal for the first stage of shift register unit. The third output signal of the shift register units other than the first stage of shift register unit is used as the first rest signal for the previous stage of shift register unit. The third output signal of the first stage of shift register unit is used as the first rest signal for the last stage of shift register unit. The first signal of the first stage of shift register unit is provided via a start signal terminal. The second reset signal of the first stage of shift register unit is provided via a cycle end signal terminal.

In another aspect, an array substrate is provided. The array substrate includes a plurality of gate lines and a plurality of data lines intersected with each other arranged in a display area, and a gate driving circuit described above. The gate driving circuit is arranged in a non-display area. The first and second signal output terminals of the respective shift register units of the gate driving circuit are connected to the plurality of the gate lines, respectively.

In another aspect, a method for driving the gate driving circuit described above is provided. In this method, in a first phase, a third clock signal at high level is inputted via a third clock signal terminal, and the gate driving circuit is caused to sequentially scan gate lines connected to a first signal output terminal of the shift register unit through the first signal output terminal. In a second phase, a fourth clock signal at high level is inputted via a fourth clock signal terminal, and the gate driving circuit is caused to sequentially scan gate lines connected to a second signal output terminal of the shift register unit through the second signal output terminal. The third clock signal and the fourth clock signal have the same signal width, and a phase difference therebetween is 180°. Each of the first and second phases has a period of a half of scanning time for one frame.

BRIEF DESCRIPTION OF THE DRAWINGS

To illustrate the embodiments of the disclosure more apparently, a brief illustration will be made for the accompanying drawings of embodiments described below. It should be understand that the drawings described hereinafter only relate to the example embodiments described herein, but in no way limit the scope of the disclosure. In these drawings.

DETAILED DESCRIPTION

For the purpose of illustrating technical features and advantages of the embodiments described herein more apparently, the embodiments will be clearly and fully described in detail with reference to the accompanying drawings. It is obvious that, the example embodiments described below are not exhaustive. Based on the embodiments of the disclosure described below, a person skilled in the art can obtain other embodiments, which also fall into the scope of the disclosure.

Figure 1:
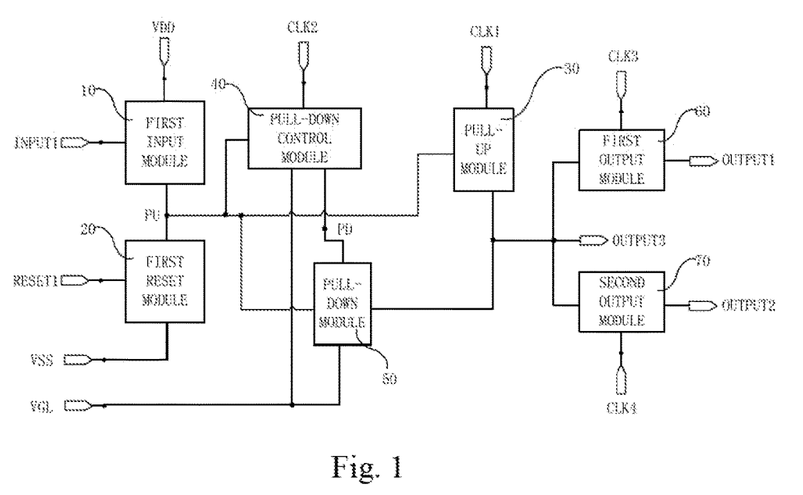
FIG. 1 is a schematic block diagram of the shift register unit according to a first embodiment.

FIG. 1 shows a schematic block diagram of the shift register unit according to a first embodiment. The shift register unit may include a first input module 10, a first reset module 20, a pull-up module 30, a pull-down control module 40, a pull-down module 50, a first output module 60 and a second output module 70, as shown in FIG. 1.

The first input module 10 may be connected to a first voltage terminal to receive a first voltage signal VDD, and connected to a first signal input terminal to receive a first signal INPUT1. The first input module 10 may output the first voltage signal VDD inputted via the first voltage terminal to a pull-up control node PU, as a pull-up control signal to charge the pull-up control node PU, under the control of the first signal INPUT1 inputted via the first signal input terminal.

The first reset module 20 is connected to the first input module 10 through the pull-up control node PU. The first reset module 20 is also connected to a second voltage terminal to receive a second voltage signal VSS, and connected to a first reset signal terminal to receive a first reset signal RESET1. The first reset module 20 may output the second voltage signal VSS to the pull-up control node PU to reset the pull-up control signal, under the control of the first reset signal RESET1.

The pull-up module 30 is connected to the first input module 10 through the pull-up control node PU, and connected to a first clock signal terminal CLK1 to receive a first clock signal CLK1. The pull-up module 30 may output the first clock signal CLK1 to the third signal output terminal, as a third output signal OUTPUT3, under the control of the pull-up control signal. Furthermore, the pull-up module 30 may output the first clock signal CLK1 to the first output module 60 and the second output module 70.

The pull-down control module 40 is connected to a second clock signal terminal to receive a second clock signal CLK2, and connected to a third voltage terminal to receive a third voltage signal VGL. The pull-down control module 40 is also connected to the first input module 10 through the pull-up control node PU. The pull-down control module 40 may output the second clock signal CLK2 to a pull-down control node PD, as a pull-down control signal, under the control of the second clock signal CLK2. Furthermore, the pull-down control module 40 may pull down a voltage at the pull-down control node PD to be identical with the voltage of the third voltage signal VGL, under the control of the pull-up control signal. In this way, the voltage of the third output signal OUTPUT3 would not be pulled down due to the high potential of the pull-down control signal at the pull-down control node PU, when the third output signal OUTPUT3 is outputted at the third signal output terminal.

In some embodiments, the first clock signal CLK1 and the second clock signal CLK2 may have the same signal width, and a phase difference therebetween is 180°.

The pull-down module 50 is connected to the pull-down control module 40 through the pull-down control node PD, and connected to the first input module 10 through the pull-up control node PU. The pull-down module 50 is also connected to the third voltage terminal to receive the third voltage signal VGL. Furthermore, the pull-down module 50 is also connected to the pull-up module 30. The pull-down module 50 may pull down the voltage of the pull-up control signal at the pull-up control node PU and the voltage of the third output signal OUTPUT3 at the third signal output terminal to be identical with the voltage of the third voltage signal VGL, under the control of the pull-down control signal.

The first output module 60 is connected to a third clock signal terminal to receive a third clock signal CLK3. The first output module 60 may output the third clock signal CLK3 to the first signal output terminal as the first output signal OUTPUT1, under the control of the third output signal OUTPUT3.

The second output module 70 is connected to a fourth clock signal terminal to receive a fourth clock signal CLK4. The second output module 70 may output the fourth clock signal terminal CLK4 to the second signal output terminal, as the second output signal OUTPUT2, under the control of the third output signal OUTPUT3.

In some embodiments, the third clock signal CLK3 and the fourth clock signal CLK4 may have the same signal width, and a phase difference therebetween is 180°.

Therefore, when a plurality of shift register units according to an embodiment constitute the gate driving circuits (which may be referred to as GOA circuit hereinafter), the first signal output terminal and the second signal output terminal of the respective shift register units may be connected to different gate lines, respectively, so that each shift register unit may output gate scan signals to the two gate lines.

Figure 2:
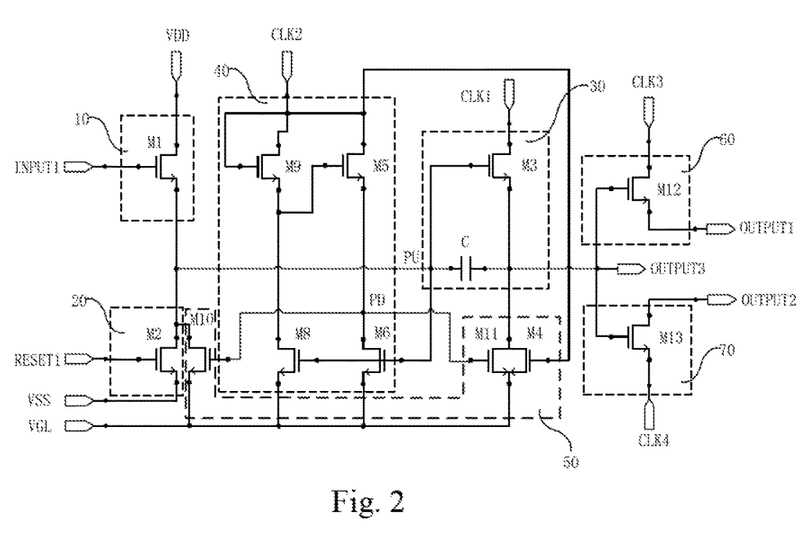
FIG. 2 is a schematic circuit diagram of an illustrative example of the shift register unit as shown in FIG. 1.

FIG. 2 shows a schematic circuit diagram of an illustrative example of the shift register unit shown in FIG. 1. In this example, the transistors are N-type transistors. A person skilled in the art will appreciate that P-type transistor may also be used.

As shown in FIG. 2, the first input module 10 may include a first transistor M1. The gate of the first transistor M1 is connected to the first signal input terminal to receive the first signal INPUT1. The first electrode (e.g. source) of the first transistor M1 is connected to the pull-up control node PU, and the second electrode (e.g. drain) of the first transistor M1 is connected to the first voltage terminal to receive the first voltage VDD.

The first reset module 20 may include a second transistor M2. The gate of the second transistor M2 is connected to the first reset signal terminal to receive the first reset signal RESET1. The first electrode (e.g. source) of the second transistor M2 is connected to the second voltage terminal to receive the second voltage VSS, and the second electrode (e.g. drain) of the second transistor M2 is connected to the pull-up control node PU.

The pull-up module 30 may include a third transistor M3 and a storage capacitor C. The gate of the third transistor M3 is connected to the pull-up control node PU. The first electrode (e.g. source) of the third transistor M3 is connected to the third signal output terminal, and the second electrode (e.g. drain) of the third transistor M3 is connected to the first clock signal terminal to receive the first clock signal CLK1.

One end of the storage capacitor C is connected to the gate of the third transistor M3 and the other end is connected to the first electrode of the third transistor M3.

The pull-down control module 40 may include a fifth transistor M5, a sixth transistor M6, an eighth transistor M8, and a ninth transistor M9. The gate of the fifth transistor M5 is connected to the second electrode (e.g. drain) of the eighth transistor M8. The first electrode (e.g. source) of the fifth transistor M5 is connected to the pull-down control node PD, and the second electrode (e.g. drain) of the fifth transistor M5 is connected to the second clock signal terminal to receive the second clock signal CLK2. The gate of the sixth transistor M6 is connected to the pull-up control node PU. The first electrode (e.g. source) of the sixth transistor M6 is connected to the third voltage terminal to receive the third voltage signal VGL, and the second electrode (e.g. drain) of the sixth transistor M6 is connected to the pull-down control node PD. The gate of the eighth transistor M8 is connected to the pull-up control node PU. The first electrode (e.g. source) of the eighth transistor M8 is connected to the third voltage terminal. The gate and second electrode (e.g. drain) of the ninth transistor M9 are each connected to the second clock signal terminal, and the first electrode (e.g. source) of the ninth transistor M9 is connected to the second electrode of the eighth transistor M8.

The pull-down module 50 may include a tenth transistor M10 and an eleventh transistor M11. The gate of the tenth transistor M10 is connected to the pull-down control node PD. The first electrode (e.g. source) of the tenth transistor M10 is connected to the third voltage terminal, and the second electrode (e.g. drain) of the tenth transistor M10 is connected to the pull-up control node PU. The gate of the eleventh transistor M11 is connected to the pull-down control node PD. The first electrode (e.g. source) of the eleventh transistor M11 is connected to the third voltage terminal, and the second electrode (e.g. drain) of the eleventh transistor M11 is connected to the pull-up module 30. In FIG. 2, the second electrode of the eleventh transistor M11 is connected to the first electrode of the third transistor M3.

Additionally, the pull-down module 50 may further include a fourth transistor M4. The gate of the fourth transistor M4 is connected to the second clock signal terminal. The first electrode (e.g. source) of the fourth transistor M4 is connected to the third voltage terminal, and the second electrode (e.g. drain) of the fourth transistor M4 is connected to the pull-up module 30. In FIG. 2, the second electrode of the fourth transistor M4 is connected to the first electrode of the third transistor M3. In this way, both of the eleventh transistor M11 and the fourth transistor M4 have their second electrode connected to the third signal output terminal and have their first electrode connected to the third voltage terminal, in the pull-down module 50. As a result, the eleventh transistor M11 and the fourth transistor M4 can be a backup for each other. Even if any one of the two transistors is failed, the third signal output signal OUTPUT3 can be pulled down to be identical with the voltage of the third voltage signal VGL by the other transistor.

The first output module 60 may include a twelfth transistor M12. The gate of the twelfth transistor M12 is connected to the third signal output terminal. The first electrode (e.g. source) of the twelfth transistor M12 is connected to the first signal output terminal, and the second electrode (e.g. drain) of the twelfth transistor M12 is connected to the third clock signal terminal to receive the third clock signal CLK3.

The second output module 70 may include a thirteenth transistor M13. The gate of the thirteenth transistor M13 is connected to the third signal output terminal. The first electrode (e.g. source) of the thirteenth transistor M13 is connected to the fourth clock signal terminal to receive the fourth clock signal CLK4, and the second electrode (e.g. drain) of the thirteenth transistor M13 is connected to the second signal output terminal.

It should be noted that, in the embodiments described herein, there is no limitation to the first electrode and the second electrode of the transistor. The first electrode may be source or drain, and the second electrode may be drain or source.

Figure 3:
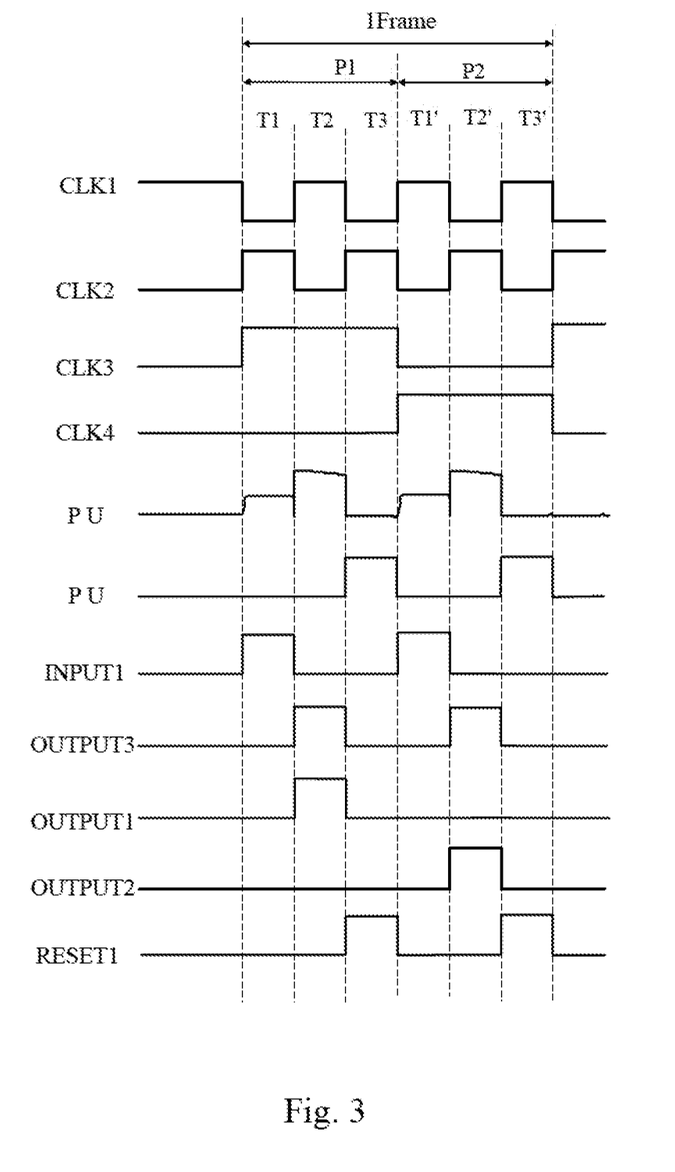
FIG. 3 is a timing chart of the signals of the shift register unit as shown in FIG. 2.

FIG. 3 shows a timing sequence diagram of the signals of the shift register unit shown in FIG. 2. The operation process of the shift register unit shown in FIG. 2 will be described below in connection with FIG. 3. A person skilled in the art will appreciate that the respective signals would be reversed in the case of P-type transistor.

In an example embodiment, assume that the first voltage signal VDD is a high level signal, and the second voltage signal VSS and the third voltage signal VGL are low level signals or ground.

During period T1 in the first phase (P1), the first clock signal CLK1=0, the second clock signal CLK2=1, the third signal CLK3=1, the fourth signal CLK4=0, the first signal INPUT1=1, and the first reset signal RESET1=0, where "1" represents high level and "0" represents low level.

During the period T1, the first transistor M1 is ON to transfer the first voltage signal VDD to the pull-up control node PU, as the pull-up control signal. At this time, the voltage at the pull-up control node PU is at high level. As a result, the storage capacitor C is charged, and the third transistor is ON, so that the first clock signal CLK1 is outputted to the third signal output terminal. At this time, the third output signal OUTPUT3 is at low level. As a result, the twelfth transistor M12 and the thirteenth transistor M13 are in OFF state.

Furthermore, the sixth transistor M6 and the eighth transistor M8 are ON due to the voltage at the pull-up control node PU. In this way, the sixth transistor M6 pulls down the voltage at the pull-down control node PD to be identical with the third voltage signal VGL, i.e. at low level. As a result, the tenth transistor M10 and the eleventh transistor M11 are in OFF state. Additionally, as the eighth transistor M8 is ON, the gate voltage of the fifth transistor M5 is pulled down to be identical with the third voltage signal VGL, i.e. at low level, so that the fifth transistor M5 is OFF.

Because the second clock signal CLK2 is at high level, the ninth transistor M9 and the fourth transistor M4 are ON. In addition, as the first reset signal RESET1 is at low level, the second transistor M2 is in OFF state.

In this way, during the period T1, only the third signal output terminal outputs the low level signal, while no signal is outputted at the first signal output terminal and the second signal output terminal, so that the shift register unit would not output the gate scan signal.

During period T2 in the first phase (P1), the first clock signal CLK1=1, the second clock signal CLK2=0, the third clock signal CLK3=1, the fourth clock signal CLK4=0, the first signal INPUT1=0, and the first reset signal RESET1=0.

During the period T2, as the first signal input INPUT1 and the first reset signal RESET1 are both at low level, the first transistor M1 and the second transistor M2 are both in OFF state. At this time, the pull-up control signal is still at high level, and accordingly the third transistor M3 is still ON, so that the first clock signal CLK1 is transferred to the third signal output terminal. At this time, the third output signal OUTPUT3 becomes a high level signal. Additionally, as the first clock signal CLK1 becomes at high level, the voltage at the pull-up control node PU is increased due to bootstrapping of the storage capacitor.

At this time, the twelfth transistor M12 and the thirteenth transistor M13 are both ON. As the third clock signal CLK3 is at high level and the fourth clock signal CLK4 is at low level, the gate scan signal may be outputted to the gate lines connected to the first signal output terminal, while no signal is outputted to the gate lines connected to the second signal output terminal. As a result, in the first phase (P1), the shift register unit can output the gate scan signal for a part of the gate lines in the display panel.

Furthermore, similar to the period T1, under the control of the pull-up control signal, the eighth transistor M8 and the sixth transistor M6 are ON, so that the fifth transistor M5 is OFF. As a result, the voltage at the pull-down control node PD is pulled down to be identical with the third voltage signal VGL, i.e. at low level. At this time, the tenth transistor M10 and the eleventh transistor M11 are in OFF state. Because the second clock signal CLK2 is at low level, the ninth transistor M9 and the fourth transistor M4 are OFF.

Thus, during the period T2, the first signal output terminal outputs the high level signal to scan the gate lines connected thereto. Therefore, the period T2 is the output time of the gate scan signal of the shift register unit in the first phase (P1).

During period T3 of the first phase (P1), the first clock signal CLK1=0, the second clock signal CLK2=1, the third clock signal CLK3=1, the fourth clock signal CLK4=0, the first signal INPUT1=0, and the first reset signal RESET1=1.

During the period T3, the first reset signal RESET1 is at high level, and the second transistor M2 is ON. Thus the second voltage signal VSS is outputted to the pull-up control node PU to reset the pull-up control signal. At this time, the third transistor M3 is OFF, and the third signal output terminal does not output any signal. Additionally, the twelfth transistor M12 and the thirteenth transistor M13 are in OFF state, so that both of the first signal output terminal and the second signal output terminal do not output any signal. Furthermore, the voltage at the pull-up control node PU is at low level, and thus the sixth transistor M6 and the eighth transistor M8 are in OFF state.

Furthermore, as the second clock signal CLK2 becomes the high level signal, the ninth transistor M9 and the fourth transistor M4 are ON, so that the fifth transistor M5 is ON and the second clock signal CLK2 is outputted to the pull-down control node PD. At this time, the voltage at the pull-down control node PD is at high level, that is, the pull-down control signal is at high level. In this case, the tenth transistor M1 and the eleventh transistor M11 are ON. The voltage of the pull-up control signal is pulled down to be identical with the third voltage signal VGL by the tenth transistor M10. The voltage of the third output signal OUTPUT3 outputted by the third signal output terminal is pulled down to be identical with the third voltage signal VGL by the eleventh transistor M11 and the fourth transistor M4, so as to avoid the third signal output terminal outputting the high level signal.

In addition, as the first signal INPUT1 becomes the low level signal, the first transistor M1 is OFF.

Therefore, during the period T3, only the third signal output terminal outputs the low level signal, and both of the first signal output terminal and the second signal output terminal do not output any signal, so that the shift register unit does not output the gate scan signal.

In the second phase (P2), the operation process of the shift register units is similar to the first phase (P1). During periods T1' and T3', the third output signal OUTPUT3 outputted by the third signal output terminal is at low level, and thus both of the first signal output terminal and the second signal output terminal would not output the gate scan signal.

During the second phase (P2), different from the first phase (P1), the third clock signal CLK3 is always at low level, and the fourth clock signal CLK4 is always at high level. Therefore, during the period T2', the second signal output terminal outputs the second output signal OUTPUT2 at high level. Therefore, the shift register unit can output the gate scan signal for the other part of the gate lines of the display panel to scan those gate lines one by one. Therefore, the period T2' is the output time of the gate scan signal of the shift register unit in the second phase (P2).

In this way, within the time for one frame (1Frame), all of the gate lines in the display panel can be scanned one by one by cycling the shift register units of the GOA circuit. For example, assume that the scan frequency is 60 HZ, then the time for one frame is 16.7 ms. In the first phase (P1) from 0 to 8.35 ms, the third clock signal CLK3 is at high level and the fourth clock signal CLK4 is at low level. As a result, the first signal output terminal outputs the high level signal in the period T2 to scan a part of the gate lines connected thereto one by one. In the second phase (P2) from 8.35 to 16.7 ms, the fourth clock signal CLK4 is at high level and the third clock signal CLK3 is at low level. Therefore, the second signal output terminal outputs the high level signal in the period T2' to scan the other part of the gate lines connected thereto one by one.

Figure 4:
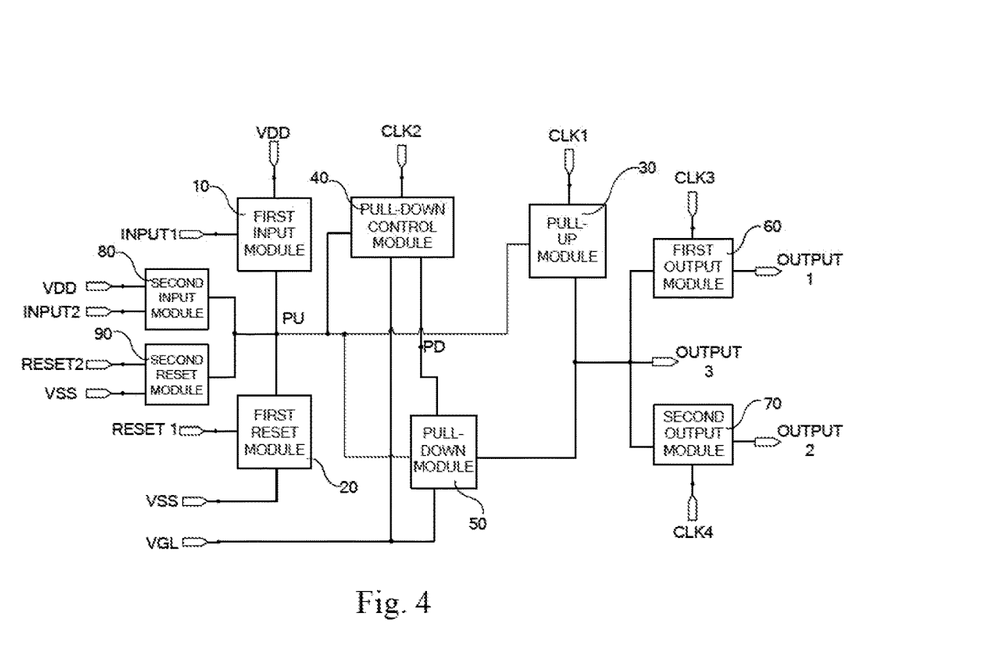
FIG. 4 is a schematic block diagram of the shift register unit according to a second embodiment.

FIG. 4 shows a schematic block diagram of the shift register unit according to a second embodiment. As shown in FIG. 4, the shift register unit further include a second input module 80 and a second reset module 90, in addition to the components of the shift register unit as shown in FIG. 1.

Specifically, the second input module 80 may be connected to the first voltage terminal to receive the first voltage signal VDD, and connected to the second signal input terminal to receive the second signal INPUT2. The second input module 80 may output the first voltage signal VDD to the pull-up control node PU, as a pull-up control signal, under the control of the second signal INPUT2.

The second reset module 90 may be connected to the second voltage terminal to receive the second voltage signal VSS, and connected to the second reset signal terminal to receive the second reset signal RESET2. The second reset module 90 may output the second voltage signal VSS to the pull-up control node PU, to reset the pull-up control signal, under the control of the second reset signal RESET2.

Figure 5:
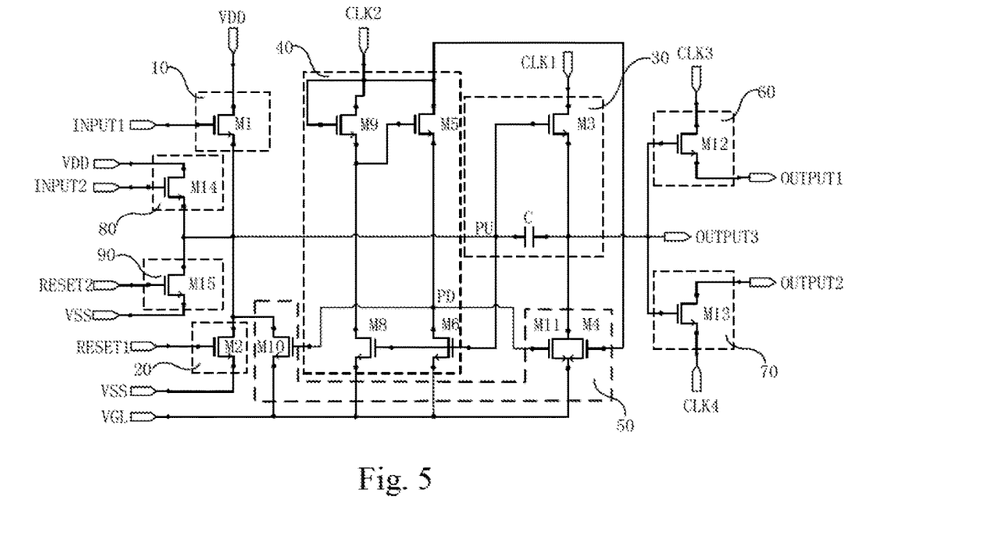
FIG. 5 is a schematic circuit diagram of an illustrative example of the shift register unit as shown in FIG. 4.

FIG. 5 shows a schematic circuit diagram of an illustrative example of the shift register unit shown in FIG. 4. In this figure, the structures of the first input module 10, the first reset module 20, the pull-up module 30, the pull-down control module 40, the pull-down module 50, the first output module 60 and the second output module 70 are same as those shown in FIG. 3, and the description is properly omitted herein.

As shown in FIG. 5, the second input module 80 may include a fourteenth transistor M14. The gate of the fourteenth transistor M14 is connected to the second signal input terminal to receive the second signal INPUT2. The first electrode (e.g. source) of the fourteenth transistor M14 is connected to the pull-up control node PU, and the second electrode (e.g. drain) of the fourteenth transistor M14 is connected to the first voltage terminal.

The second reset module 90 may include a fifteenth transistor M15. The gate of the fifteenth transistor M15 is connected to the second reset signal terminal to receive the second reset signal RESET2. The first electrode (e.g. source) of the fifteenth transistor M15 is connected to the second voltage terminal, and the second electrode (e.g. drain) of the fifteenth transistor M15 is connected to the pull-up control node PU.

It can be seen from the above description that the shift register unit according to the embodiments described herein can control ON or OFF of the first output module 60 and the second output module 70 through the third output signal OUTPUT3 outputted at the third signal output terminal. In the case that the first output module 60 is ON, the third clock signal CLK3 can be outputted to the first signal output terminal. In the case that the second output module 70 is ON, the fourth clock signal CLK4 can be outputted to the second signal output terminal. In this way, in the gate driving circuit composed of a plurality of shift register units, the first signal output terminals of all the shift register units can output the gate scan signal to scan a part of the gate lines connected thereto one by one in the first half of the time for one frame by means of the third clock signal CLK3, and the second signal output terminal of all the shift register units can output the gate scan signal to scan the other part of the gate lines connected thereto one by one in the second half of the time of one frame by means of the fourth clock signal CLK4, and thus all the gate lines can be scanned. In addition, as the first signal output terminal and the second signal output terminal are connected to different gate lines, respectively, the number of the shift register units in the GOA circuit can be reduced, which facilitates implementing the display panel with ultra-narrow frame or without frame.

Figure 6:
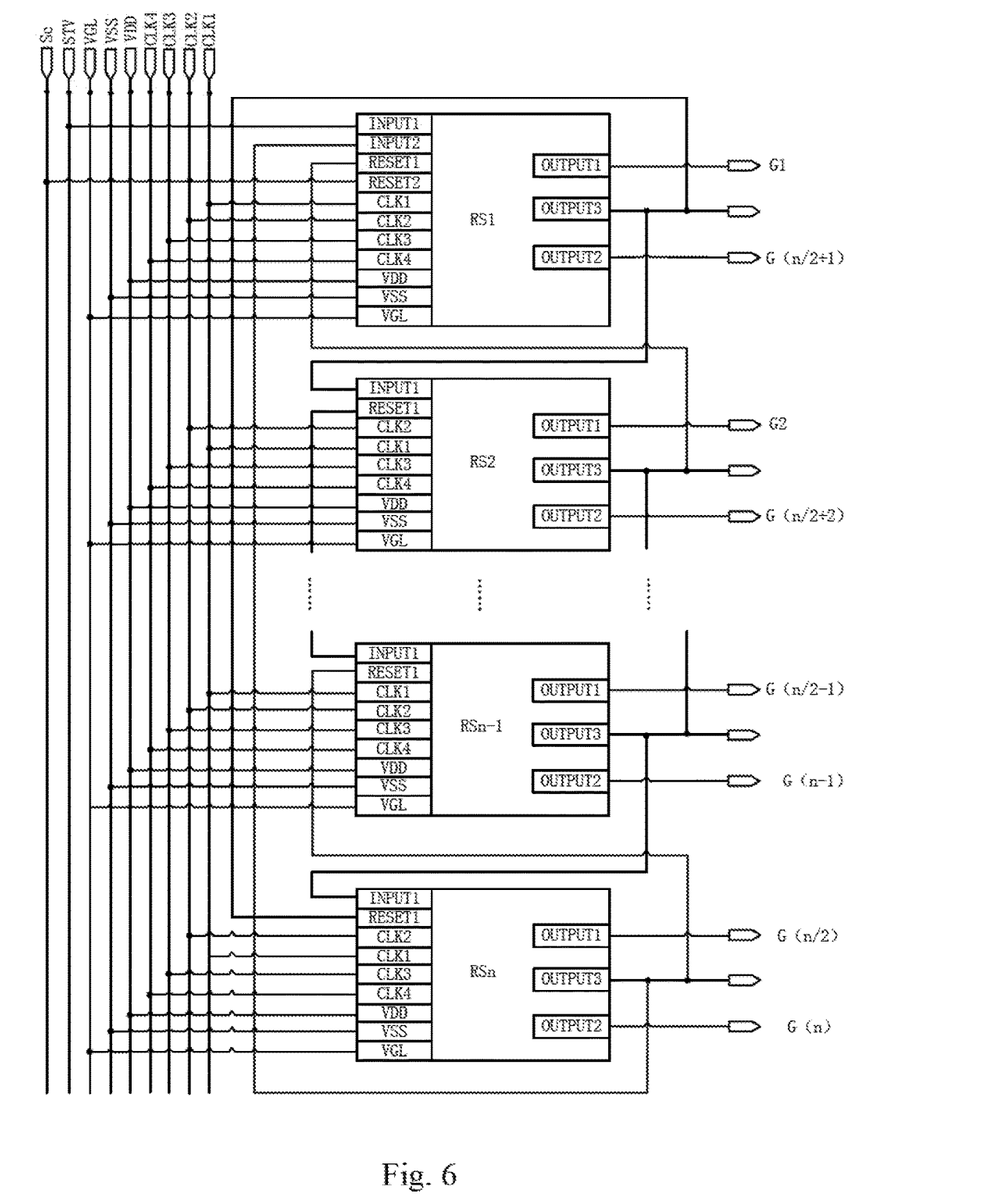
FIG. 6 is a schematic diagram of the gate driving circuit according to an example embodiment.

FIG. 6 shows a schematic diagram of the GOA circuit according to an example embodiment. In the embodiment, the GOA circuit may include a plurality of the cascaded shift register units. In the GOA circuit as shown in FIG. 6, the first stage of shift register unit RS1 is the shift register unit as shown in FIG. 2, and other shift register units RS2, RS3 . . . , RSn are the shift register unit as shown in FIG. 1.

As shown in FIG. 6, in the GOA circuit, except for the first stage of shift register unit RS1, the first signal input terminals of the other stages of shift register unit RS2, RS3 . . . , RSn are connected to the third signal output terminal of their previous stages of shift register unit RS1, RS2 . . . , RSn−1. In other words, except for the last stage of shift register unit RSn, the third output signals OUTPUT3 of the other shift register units RS1, RS2 . . . , RSn−1 are used as the first signals INPUT1 for their next stages of shift register unit RS2, RS3 . . . , RSn.

Expect for the last stage of shift register unit RSn, the first reset signal terminals of the other shift register units RS1, RS2 . . . , RSn−1 are connected to the third signal output terminals of their next stages of shift register unit RS2, RS3 . . . , RSn. In other words, except for the first stage of shift register unit RS1, the third output signals OUTPUT3 of the other shift register units RS2, RS3 . . . , RSn are used as the first reset signals RESET1 for their previous stages of shift register unit RS1, RS2 . . . , RSn−1.

The first signal input terminal of the first stage of shift register unit RS1 is connected to a start signal terminal STV, so that the first signal INPUT1 of the first stage of shift register unit RS1 is provided via the start signal terminal STV. After the start signal is inputted via the start signal terminal STV, the GOA circuit starts to scan the gate lines in the display panel. In addition, the second signal input terminal of the first stage of shift register unit RS1 is connected to the third signal output terminal of the last stage of shift register units RSn. In other words, the third output signal OUTPUT3 of the last stage of shift register units RSn is used as the second signal INPUT2 for the first stage of shift register units RS1.

The first reset signal terminal of the last stage of shift register unit RSn is connected to the third signal output terminal of the first stage of shift register unit RS1. In other words, the third output signal OUTPUT3 of the first stage of shift register unit RS1 is used as the first reset signal RESET1 for the last stage of shift register unit RSn.

The second reset signal terminal RESET2 of the first stage of shift register unit RS1 is connected to a cycle end signal terminal Sc, and the second reset signal RESET2 of the first stage of shift register unit RS1 is provided via the cycle end signal terminal Sc.

In the GOA circuit of the example embodiment, all the shift register units of the GOA circuit may be connected together to form a loop by connecting the third signal output terminal of the last stage of shift register unit RSn to the second signal input terminal of the first stage of shift register unit RS1. In this way, in each stage of shift register unit, the first output module 60 is connected to the third clock signal terminal, and the second output module 70 is connected to the fourth clock signal terminal. Therefore, in the first ½ of the time for one frame (i.e., P1 phase), the third clock signal CLK3 at high level is inputted at the third clock signal terminal, so that the first signal output terminals of all the shift register units can output the gate scan signals to scan a part of the gate lines connected thereto one by one, and in the second ½ of the time for one frame (i.e., P2 phase), the fourth clock signal CLK4 at high level is inputted at the fourth clock signal terminal, so that the second signal output terminals of all the shift register units can output the gate scan signals to scan the remaining gate lines one by one, as shown in FIG. 3. Accordingly, all the shift register units in the GOA circuit may be cycled in one frame and thus all the gate lines can be scanned. In addition, the third clock signal CLK3 and the fourth clock signal CLK4 are reversed only once during the cycle, and thus the power consumption is low.

On the other hand, the second reset signal terminal of the first stage of shift register unit RS1 is connected to the cycle end signal terminal Sc. Therefore, the cycling process of the shift register units of the GOA circuit can be terminated by inputting an end signal at the cycle end signal terminal Sc any time.

Furthermore, it is possible to terminate the cycle process of the shift register units by inputting the second reset signal RESET2 at high level at the second reset signal terminal to turn on the fifteenth transistor M15 to transfer the second voltage signal VSS to the pull-up control node PU.

It should be noted that in the GOA circuit according to the example embodiment, there is no restriction to the gate lines connected to the first signal output terminal and the gate lines connected to the second signal output terminal, as long as the gate lines connected to the first signal output terminal and the gate lines connected to the second signal output terminal are different. For example, the first signal output terminal may be connected to the odd-numbered gate line, and the second signal output terminal may be connected to the even-numbered gate line. In some embodiments of, the first signal output terminal may be connected to the gate lines (G1, G2 . . . , Gn/2) in the upper portion of the display panel, and the second signal output terminal may be connected to the gate lines (Gn/2+1, Gn/2+2, Gn) in the lower portion.

It can be seen from the above description that, with the GOA circuit of the embodiments, each shift register unit in the GOA circuit can work twice in the time for one frame according to the third clock signal CLK3 and the fourth clock signal CLK4 to scan all the gate lines. In this way, compared with the existing GOA circuit in which each shift register unit corresponds to one gate line, the number of the shift register units can be reduced, and thus the cost can be reduced and the wiring space can be decreased, which may facilitate implementing the display panel with ultra-narrow frame or without frame.

Figure 7:
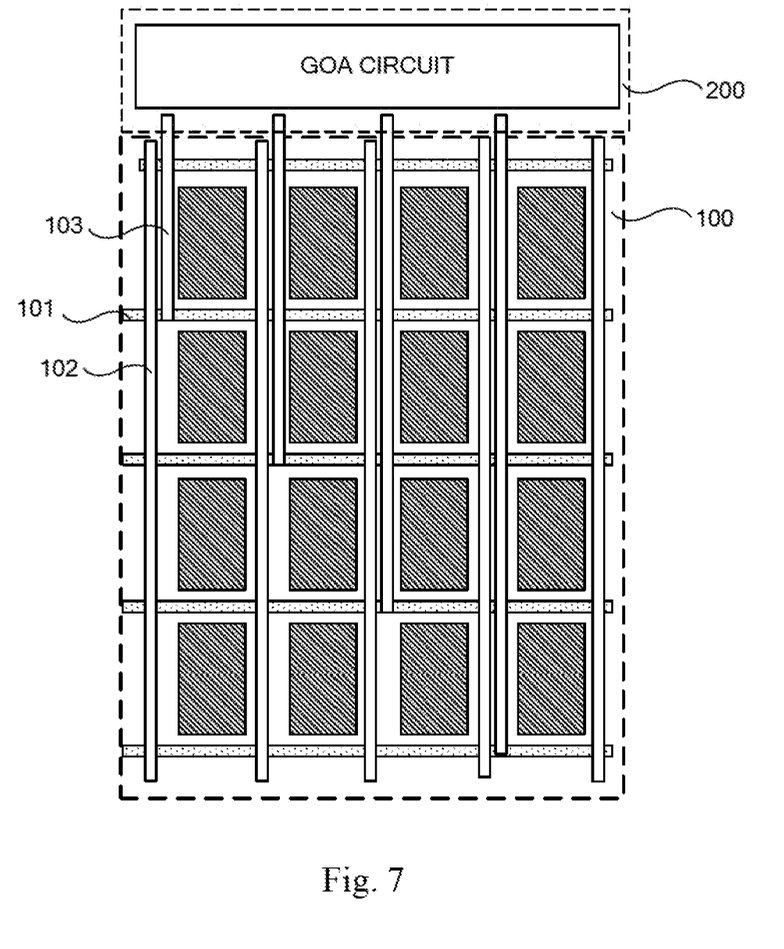
FIG. 7 is a schematic diagram of the array substrate according to an example embodiment.

FIG. 7 shows a schematic diagram of the array substrate according to an embodiment. As shown in FIG. 7, the array substrate includes a plurality of gate lines 101 and a plurality of data lines 102 intersected with each other arranged in a display area 100, and a GOA circuit as shown in FIG. 6. The GOA circuit may be arranged in a non-display area, for example, an extension area 200 of the date lines 102. The extension area 200 is adjacent to the display area 100.

Furthermore, the first signal output terminal and the second signal output terminal of each of the shift register units in the GOA circuit are connected to the corresponding gate lines 101 via data leads 103. The data leads 103 may be arranged in parallel with the data lines 102 in order to save the wiring space.

Generally, the data leads 103 may be formed with the same material as the data lines 102 and at the same layer as the data lines 102, in order to form the data leads 103 while forming the data lines 102. However, as the data leads 103 need to be connected to the gate lines 101 and a gate insulation layer is arranged between the gate lines 101 and the data lines 102, via holes may be arranged in the gate insulation layer. In this way, the data leads 103 arranged at the same layer as the data lines 102 may be connected to the gate lines 101 through the via holes.

In the array substrate of the embodiment, the GOA circuit may be arranged in the extension area 200 of the data lines 102. Compared to the existing solution in which the GOA circuit is arranged at the left and right sides of the display panel, it can save the non-display areas at the left and right sides of the display panel, which facilitates implementing the display panel with ultra-narrow frame or without frame.

Figure 8:
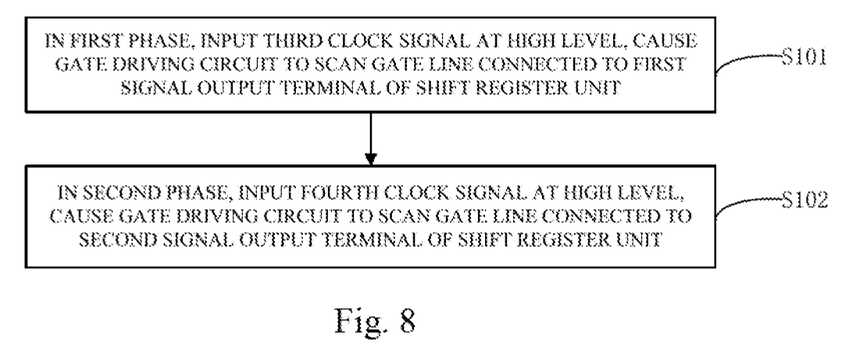
FIG. 8 is a schematic flow chart of the method for driving the gate driving circuit according to an example embodiment.

FIG. 8 shows a schematic flow chart of the method for driving the gate driving circuit as shown in FIG. 6 according to an embodiment. As shown in FIG. 8, at step S101, in the first phase (P1) shown in FIG. 3, in particular, in the period T2, the third clock signal CLK3 at high level is inputted via the third clock signal terminal, and the GOA circuit is caused to scan the gate lines connected to the first signal output terminal of each shift register unit through the first signal output terminal one by one.

At step S102, in the second phase (P2), in particular, in the period T2', the fourth clock signal CLK4 at high level is inputted via the fourth clock signal terminal, and the GOA circuit is caused to scan the gate lines connected to the second signal output terminal of each shift register unit through the second signal output terminal one by one.

In some embodiments, the third clock signal CLK3 and the fourth clock signal CLK4 may have the same signal width and a phase difference therebetween is 180°. In addition, each of the first phase (P1) and the second phase (P2) may have a period of ½ of the scanning time for one frame.

Although in the above description, the step 101 is performed prior to the step S102, a person skilled in the art will appreciate that the step S102 may be performed prior to the step S101.

With the method for driving a gate driving circuit of the example embodiment, the first signal output terminals of all the shift register units can output the gate scan signals to scan a part of the gate lines connected thereto in the first ½ of the time for one frame by means of the third clock signal, and the second signal output terminals of all the shift register units can output the gate scan signals to scan the other part of the gate lines connected thereto in the second ½ of the time for one frame by means of the fourth clock signal. In this way, all the gate lines can be scanned. Since the first signal output terminal and the second signal output terminal of each shift register unit may be connected to different gate lines, respectively, the number of the shift register units in the GOA circuit can be reduced, which may facilitate implementing the display panel with ultra-narrow frame or without frame.

Although several example embodiments have been described in detail above, the scope of the disclosure is not limited thereto. Obviously, a person skilled in the art may make various modifications and variations to the above embodiments, without departing from the scope and spirit of the present invention. The scope of the disclosure is defined by the appending claims.

What is claimed is:

1. A gate driving circuit comprising at least two cascaded shift register units, wherein each shift register unit comprises:
   a first input module connected to a first voltage terminal to receive a first voltage signal, and connected to a first signal input terminal to receive a first signal, the first input module configured to output the first voltage signal as a pull-up control signal under the control of the first signal;
   a first reset module connected to the first input module, connected to a second voltage terminal to receive a second voltage signal, and connected to a first reset signal terminal to receive a first reset signal, the first reset module configured to reset the pull-up control signal under the control of the first reset signal;
   a pull-up module connected to the first input module, and connected to a first clock signal terminal to receive a first clock signal, the pull-up module configured to output the first clock signal under the control of the pull-up control signal, wherein the first clock signal is output as a third output signal via a third signal output terminal;
   a pull-down control module connected to the first input module, connected to a second clock signal terminal to receive a second clock signal, and connected to a third voltage terminal to receive a third voltage signal, the pull-down control module configured to output the second clock signal as a pull-down control signal under the control of the second clock signal, and configured to pull down a voltage of the pull-down control signal to be equal to the third voltage signal under the control of the pull-up control signal;
   a pull-down module connected to the first input module, the pull-down control module, and the pull-up module, and further connected to the third voltage terminal to receive the third voltage signal, the pull-down configured to pull down a voltage of the pull-up control signal and a voltage of the third output signal to be equal to the third voltage signal under the control of the pull-down control signal;
   a first output module connected to a third clock signal terminal to receive a third clock signal, and connected to the pull-up module, the first output module configured to output the third clock signal, under the control of the third output signal, as a first output signal via a first signal output terminal; and a second output module connected to a fourth clock signal terminal to receive a fourth clock signal, and connected to the pull-up module, the second output module configured to output the fourth clock signal, under the control of the third output signal, as a second output signal via a second signal output terminal, wherein a first stage shift register unit of the at least two shift register units further comprises a second input module and a second reset module, wherein the third output signal of a shift register unit other than a last stage shift register unit of the at least two shift register units is used as the first signal for a next stage shift register unit, and wherein the third output signal of the last stage shift register unit is used as a second signal for the first stage shift register unit, wherein the third output signal of a shift register unit other than the first stage shift register unit is used as the first reset signal for a previous stage shift register unit, and wherein the third output signal of the first stage shift register unit is used as the first reset signal for the last stage shift register unit, wherein the first signal of the first stage shift register unit is provided via a start signal terminal; and wherein a second reset signal of the first stage shift register unit is provided via a cycle end signal terminal.

2. The gate driving circuit according to claim 1, wherein the second input module is connected to the first voltage terminal to receive the first voltage signal, and connected to a second signal input terminal to receive the second signal, the second input module configured to output the first voltage signal as the pull-up control signal under the control of the second signal.

3. The gate driving circuit according to claim 2, wherein the second reset module is connected to the second voltage terminal to receive the second voltage signal, and connected to a second reset signal terminal to receive the second reset signal, the second reset module configured to reset the pull-up control signal under the control of the second reset signal.

4. The gate driving circuit according to claim 1, wherein the first output module comprises a twelfth transistor, wherein a gate of the twelfth transistor is connected to the pull-up module, a first electrode of the twelfth transistor is connected to the first signal output terminal, and a second electrode of the twelfth transistor is connected to the third clock signal terminal.

5. The gate driving circuit according to claim 1, wherein the second output module comprises a thirteenth transistor, wherein a gate of the thirteenth transistor is connected to the pull-up module, a first electrode of the thirteenth transistor is connected to the fourth clock signal terminal, and a second electrode of the thirteenth transistor is connected to the second signal output terminal.

6. The gate driving circuit according to claim 2, wherein the second input module comprises a fourteenth transistor, wherein a gate of the fourteenth transistor is connected to the second signal input terminal, a first electrode of the fourteenth transistor is connected to the pull-up module, and a second electrode of the fourteenth transistor is connected to the first voltage terminal.

7. The gate driving circuit according to claim 3, wherein the second reset module comprises a fifteenth transistor, wherein a gate of the fifteenth transistor is connected to the second reset signal terminal, a first electrode of the fifteenth transistor is connected to the second voltage terminal, and a second electrode of the fifteenth transistor is connected to the second input module.

8. The gate driving circuit according to claim 1, wherein the first input module comprises a first transistor, wherein a gate of the first transistor is connected to the first signal input terminal, a first electrode of the first transistor is connected to the pull-up module, and a second electrode of the first transistor is connected to the first voltage terminal.

9. The gate driving circuit according to claim 1, wherein the first reset module comprises a second transistor, wherein a gate of the second transistor is connected to the first reset signal terminal, a first electrode of the second transistor is connected to the second voltage terminal, and a second electrode of the second transistor is connected to the first input module.

10. The gate driving circuit according to claim 1, wherein the pull-up module comprises:

a third transistor, wherein a gate of the third transistor is connected to the first input module, a first electrode of the third transistor is connected to the third signal output terminal, and a second electrode of the third transistor is connected to the first clock signal terminal; and a storage capacitor connected between the gate of the third transistor and the first electrode of the third transistor.

11. The gate driving circuit according to claim 3, wherein the pull-up module comprises:

a third transistor, wherein a gate of the third transistor is connected to the first input module and the second input module, a first electrode of the third transistor is connected to the third signal output terminal, and a second electrode of the third transistor is connected to the first clock signal terminal; and a storage capacitor connected between the gate of the third transistor and the first electrode of the third transistor.

12. The gate driving circuit according to claim 1, wherein the pull-down module comprises a fifth transistor, a sixth transistor, an eighth transistor, and a ninth transistor, wherein a gate of the fifth transistor is connected to a second electrode of the eighth transistor, a first electrode of the fifth transistor is connected to the pull-down module, and a second electrode of the fifth transistor is connected to the second clock signal terminal, wherein a gate of the sixth transistor is connected to the first input module, a first electrode of the sixth transistor is connected to the third voltage terminal, and a second electrode of the sixth transistor is connected to the first electrode of the fifth transistor, wherein a gate of the eighth transistor is connected to the pull-up module, and a first electrode of the eighth transistor is connected to the third voltage terminal, and wherein a gate and second electrode of the ninth transistor are each connected to the second clock signal terminal, and a first electrode of the ninth transistor is connected to the second electrode of the eighth transistor.

13. The gate driving circuit according to claim 1, wherein the pull-down module comprises a tenth transistor and an eleventh transistor, wherein a gate of the tenth transistor is connected to the pull-down control module, a first electrode of the tenth transistor is connected to the third voltage terminal, and a second electrode of the tenth transistor is connected to the first input module, and wherein a gate of the eleventh transistor is connected to the gate of the tenth transistor, a first electrode of the eleventh transistor is connected to the third voltage terminal, and a second electrode of the eleventh transistor is connected to the pull-up module.

14. The gate driving circuit according to claim 13, wherein the pull-down module further comprises a fourth transistor, wherein a gate of the fourth transistor is connected to the second clock signal terminal, a first electrode of the fourth transistor is connected to the third voltage terminal, and a second electrode of the fourth transistor is connected to the pull-up module.

15. An array substrate comprising:
- a plurality of gate lines and a plurality of data lines intersected with each other and arranged in a display area; and
- a gate driving circuit according to claim 1;
- wherein the gate driving circuit is arranged in a non-display area; and
- wherein the first and second signal output terminals of the respective shift register units of the gate driving circuit are connected to the plurality of the gate lines respectively.

16. A method for driving a gate driving circuit according to claim 1, comprising:
- in a first phase, for a shift register unit of the at least two shift register units, inputting the third clock signal at high level via the third clock signal terminal, and causing the gate driving circuit to sequentially scan gate lines connected to the first signal output terminal of the shift register unit; and
- in a second phase, for the shift register unit, inputting the fourth clock signal at high level via the fourth clock signal terminal, and causing the gate driving circuit to sequentially scan gate lines connected to the second signal output terminal of the shift register unit;
- wherein the third clock signal and the fourth clock signal have the same signal width, and wherein a phase difference between the third and fourth clock signals is 180°; and
- wherein each of the first and second phases has a period of a half of a scanning time for one frame.

* * * * *